US008924043B2

(12) United States Patent
Maslyn et al.

(10) Patent No.: US 8,924,043 B2
(45) Date of Patent: Dec. 30, 2014

(54) SYSTEMS AND METHODS FOR PREVENTING BATTERY DEPLETION IN A VEHICLE

(75) Inventors: Andrew J. Maslyn, Rochester, NY (US); John P. Salvador, Penfield, NY (US)

(73) Assignee: GM Global Technology Operations LLC, Detroit, MI (US)

( * ) Notice: Subject to any disclaimer, the term of this patent is extended or adjusted under 35 U.S.C. 154(b) by 222 days.

(21) Appl. No.: 13/549,031

(22) Filed: Jul. 13, 2012

(65) Prior Publication Data
US 2014/0018975 A1 Jan. 16, 2014

(51) Int. Cl.
*G05D 1/00* (2006.01)
*G05D 3/00* (2006.01)

(52) U.S. Cl.
USPC .................................. 701/2; 701/29; 701/33

(58) Field of Classification Search
CPC .. G05B 19/0421; G05B 15/02; G05B 19/042; G06Q 50/22; G06Q 50/24
USPC ................................. 701/2, 29, 33
See application file for complete search history.

(56) References Cited

U.S. PATENT DOCUMENTS

| 7,698,060 | B2* | 4/2010 | Nomura | 701/455 |
| 7,829,228 | B2* | 11/2010 | Kallo et al. | 429/430 |
| 8,051,051 | B2* | 11/2011 | Nomura | 707/694 |
| 8,206,860 | B2* | 6/2012 | Ganapathy et al. | 429/430 |
| 8,447,790 | B2* | 5/2013 | Kutomi et al. | 707/803 |
| 8,478,522 | B2* | 7/2013 | Ohira et al. | 701/450 |
| 8,538,689 | B2* | 9/2013 | Matsunaga | 701/461 |
| 8,571,793 | B2* | 10/2013 | Matsunaga | 701/461 |
| 2005/0203937 | A1* | 9/2005 | Nomura | 707/102 |
| 2006/0155462 | A1* | 7/2006 | Sumizawa et al. | 701/208 |
| 2007/0106463 | A1* | 5/2007 | Nomura | 701/208 |
| 2009/0021385 | A1* | 1/2009 | Kelty et al. | 340/660 |
| 2009/0091291 | A1* | 4/2009 | Woody et al. | 320/109 |
| 2009/0210357 | A1* | 8/2009 | Pudar et al. | 705/412 |
| 2010/0109931 | A1* | 5/2010 | Esnard et al. | 341/176 |
| 2010/0174667 | A1* | 7/2010 | Vitale et al. | 705/412 |
| 2010/0301810 | A1* | 12/2010 | Biondo et al. | 320/155 |
| 2011/0022256 | A1* | 1/2011 | Asada et al. | 701/22 |
| 2011/0057612 | A1* | 3/2011 | Taguchi et al. | 320/109 |
| 2011/0086286 | A1* | 4/2011 | Ganapathy et al. | 429/432 |
| 2011/0178654 | A1* | 7/2011 | Bauerle et al. | 701/2 |
| 2011/0187719 | A1* | 8/2011 | Usui et al. | 345/441 |
| 2011/0191016 | A1* | 8/2011 | Nomura et al. | 701/200 |
| 2011/0191020 | A1* | 8/2011 | Matsunaga | 701/201 |
| 2011/0191357 | A1* | 8/2011 | Tanaka et al. | 707/752 |
| 2011/0191379 | A1* | 8/2011 | Watanabe et al. | 707/792 |
| 2011/0191387 | A1* | 8/2011 | Kutomi et al. | 707/803 |
| 2011/0191388 | A1* | 8/2011 | Matsunaga et al. | 707/803 |
| 2011/0276194 | A1* | 11/2011 | Emalfarb et al. | 700/297 |

(Continued)

*Primary Examiner* — Ian Jen
(74) *Attorney, Agent, or Firm* — Phillips Ryther & Winchester; John P. Davis

(57) ABSTRACT

System and methods for preventing battery depletion in a vehicle are disclosed. In certain embodiments, a method for preventing depletion of a battery included in a vehicle may include receiving a measurement of the SOC of the battery from an SOC sensor. A determination may be made as to whether the SOC of the battery has reached a threshold indicating that the battery is nearing depletion. Based on the determination, a notification may be transmitted to a remote device associated with a user of the vehicle. In certain embodiments, the user may use the notification to decide whether to remotely start a system of the vehicle to recharge the battery.

16 Claims, 3 Drawing Sheets

(56) References Cited

U.S. PATENT DOCUMENTS

| | | | |
|---|---|---|---|
| 2012/0025769 A1* | 2/2012 | Kikuchi et al. | 320/118 |
| 2012/0029729 A1* | 2/2012 | Weslati et al. | 701/2 |
| 2012/0049787 A1* | 3/2012 | Kuroiwa | 320/106 |
| 2012/0084002 A1* | 4/2012 | Matsunaga | 701/430 |
| 2012/0086395 A1* | 4/2012 | Kim et al. | 320/109 |
| 2012/0098676 A1* | 4/2012 | Oizumi et al. | 340/901 |
| 2012/0101659 A1* | 4/2012 | Kim et al. | 701/2 |
| 2012/0106672 A1* | 5/2012 | Shelton et al. | 375/295 |
| 2012/0109401 A1* | 5/2012 | Shelton et al. | 700/297 |
| 2012/0109402 A1* | 5/2012 | Shelton et al. | 700/297 |
| 2012/0109403 A1* | 5/2012 | Shelton et al. | 700/297 |
| 2012/0109797 A1* | 5/2012 | Shelton et al. | 705/34 |
| 2012/0109798 A1* | 5/2012 | Shelton et al. | 705/34 |
| 2014/0018975 A1* | 1/2014 | Maslyn et al. | 701/2 |

* cited by examiner

SYSTEMS AND METHODS FOR PREVENTING BATTERY DEPLETION IN A VEHICLE

TECHNICAL FIELD

This disclosure relates to systems and methods for preventing battery depletion in a vehicle. More specifically, but not exclusively, this disclosure relates to systems and methods for preventing battery depletion in a vehicle utilizing a telematics system.

BACKGROUND

Passenger vehicles often include electric batteries for operating features of vehicle electrical and drivetrain systems. For example, vehicles commonly include a 12V lead-acid automotive battery configured to supply electric energy to vehicle starter systems (e.g., a starter motor), lighting systems, and/or ignition systems. In electric, fuel cell ("FC"), and/or hybrid vehicles, a low voltage vehicle battery may be used to supply electric energy to a certain subset of vehicle features not powered by a high voltage ("HV") battery system used primarily to power electric drivetrain components (e.g., electric drive motors and the like).

Over sustained periods of vehicle non-use, the state-of-charge ("SOC") of a vehicle battery may fall to undesirably low levels. For example, in certain circumstances, some vehicle electrical systems (e.g., clocks, vehicle alarms, and the like) may continue to draw electrical energy from the vehicle battery even when the vehicle is not operating. In further circumstances, a vehicle operator may inadvertently leave on lighting systems and/or other vehicle systems that draw energy from the vehicle battery when the vehicle is not operating. Over sustained periods, this may cause the vehicle battery to deplete.

FC systems included in FC electric vehicles may experience progressive damage under sustained periods of non-use (i.e., "off-time"). To mitigate this damage, hydrogen may be periodically introduced into the FC system to maintain a hydrogen-rich environment in the system. Periodically introducing hydrogen into the FC system, however, may also undesirably contribute to the depletion of the vehicle's battery (e.g., the low voltage battery), due to the potential use of electrical power to operate valves, sensors and/or controllers.

SUMMARY

Systems and methods are presented for preventing battery depletion in a vehicle. In certain embodiments, a method for preventing depletion of a battery included in a vehicle may include receiving a measurement of the SOC of the battery from an SOC sensor. A determination may be made as to whether the SOC of the battery has reached a threshold indicating that the battery is nearing depletion. Based on the determination, a notification may be transmitted to a remote device associated with a user of the vehicle. In certain embodiments, the user may use the notification to decide whether to remotely start a system of the vehicle to recharge the battery.

In further embodiments, a telematics system for preventing depletion of a battery included in a vehicle may include a receiver configured to receive a measured SOC of the battery from an SOC sensor. The telematics system may further include processing logic communicatively coupled to the receiver configured to determine whether the received measured SOC of the battery has reached a threshold. A transmitter communicatively coupled with the processing logic may be configured to transmit a notification to a remote device associated with the user comprising an indication that the SOC of the battery is low. Based on the notification, the user may direct the telematics system to start a system of the vehicle to recharge the battery.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

A detailed description of systems and methods consistent with embodiments of the present disclosure is provided below. While several embodiments are described, it should be understood that disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Embodiments of the systems and methods disclosed herein may utilize certain features of a telematics system included in a vehicle to warn a user of battery depletion and to take steps to prevent battery depletion. Particularly, some embodiments of systems and methods disclosed herein may allow a vehicle operator to remotely start a vehicle power system configured to recharge a battery included in the vehicle based on a determination that the SOC of the battery has fallen to an undesirably low level, thereby preventing depletion of the battery. Other embodiments may provide for other related functions, such as notifying a user of a low battery voltage, a battery that is failing to properly hold a charge and therefore is in need of being replaced, or a battery that is otherwise showing one or more signs of improper function or failure. Such notifications may take place by, for example, text message, email, telephone call, voicemail, or through a telematics system notification.

Figure 1:
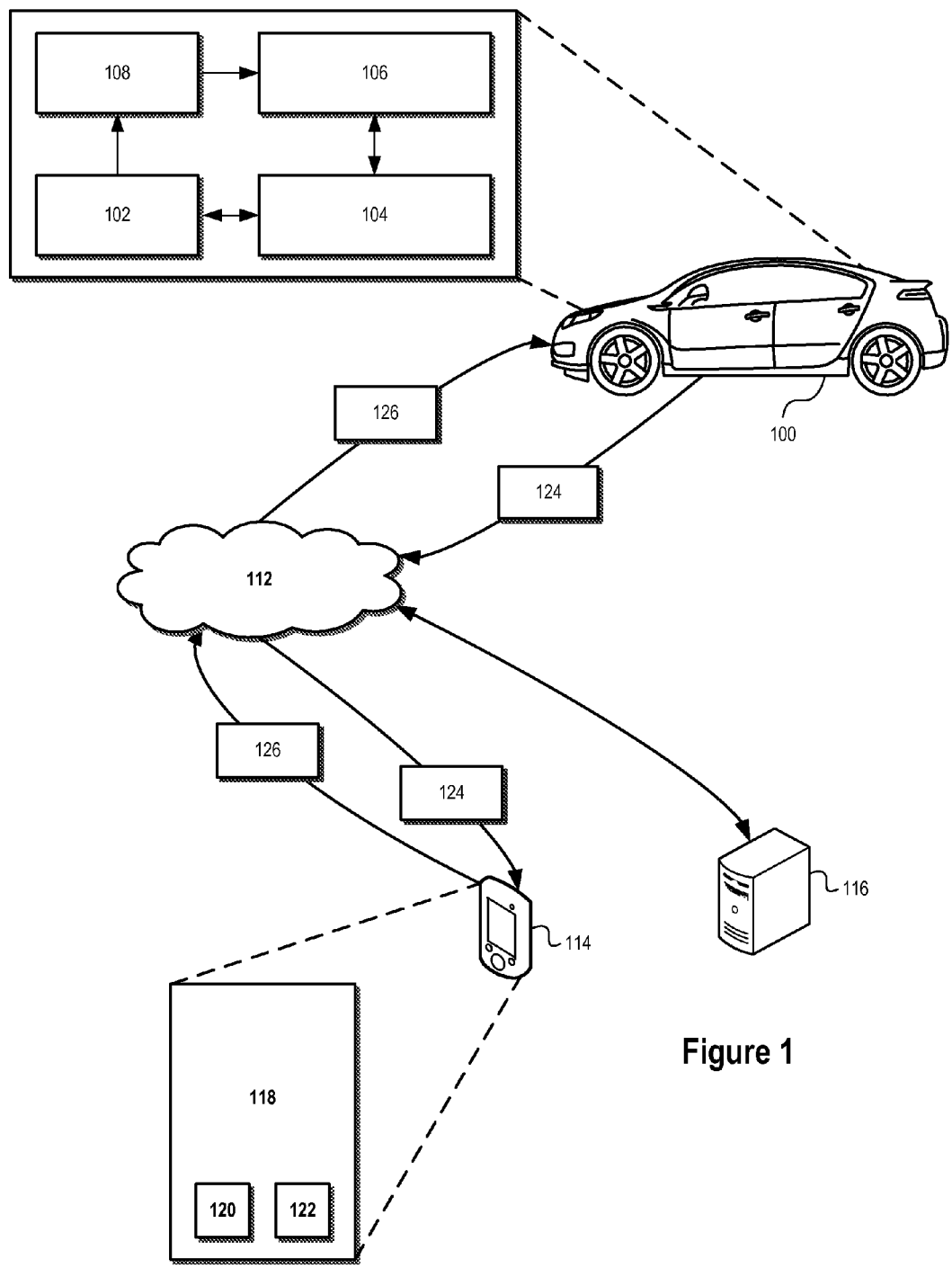
FIG. 1 illustrates an exemplary system for preventing battery depletion in a vehicle consistent with embodiments disclosed herein.

FIG. 1 illustrates an exemplary system for preventing battery depletion in a vehicle 100 consistent with embodiments disclosed herein. The vehicle 100 may be a motor vehicle, a marine vehicle, an aircraft, and/or any other type of vehicle, and may include an internal combustion engine ("ICE") drivetrain, an electric motor drivetrain, a hybrid engine drivetrain, a FC drivetrain, and/or any other type of drivetrain suitable for incorporating the systems and methods disclosed herein. The vehicle 100 may include a vehicle battery 102 that, in certain embodiments, may be a low voltage battery. The vehicle battery 102 may be configured to supply electric energy to a variety of vehicle 100 systems including, for example, vehicle starter systems (e.g., a starter motor), lighting systems, ignition systems, and/or the like. In some embodiments, the vehicle battery 102 may be a lead-acid 12V automotive battery.

The vehicle battery 102 may be electrically coupled with a vehicle power system 104 and be configured to supply electric energy to various systems of the power system 104. For example, as discussed above, the vehicle battery 102 may be electrically coupled with a starter motor of a power system 104 including an ICE. The vehicle battery 102 may be capable of being charged by one or more systems associated with the vehicle power system 104. For example, the vehicle battery 102 may be electrically connected to an alternator configured to convert mechanical energy provided by the vehicle power system 104 into electrical energy utilized to charge the battery 102. In a vehicle 100 that utilizes a HV battery system to power electric drivetrain components (e.g., an electric, hybrid, or FC power system), the vehicle battery 102 may be electrically connected to the HV battery system (e.g., via a transformer or the like), and may be configured to be recharged using electrical energy supplied by the HV battery system. In further embodiments, the vehicle battery 102 may be electrically connected to a FC power system, a capacitor system (e.g., an ultra-capacitor and/or a super-capacitor), and/or any other suitable system, and may be configured to be recharged using electrical energy supplied by such systems.

The vehicle may further include a telematics system 106. In certain embodiments, the telematics system 106 may comprise an OnStar® system by OnStar® Corporation, a subsidiary of General Motors Corporation. The telematics system 106 may be capable of performing a variety of functions. For example, the telematics system 106 may allow a user to remotely start a vehicle 100 (e.g., start an ICE) from a device 114 associated with the user, may provide information related to a specific point of interest in response to a request from a user (e.g., location and/or mapping lookup), may provide vehicle 100 status information, may provide automatic collision notification to relevant governmental authorities and/or service provider representatives, and/or may provide any other related service provider function(s) and/or vehicle information to a user. As used herein, the telematics system 106 may be any system configured to send and receive information from the vehicle 100 using any suitable telecommunications technology. The telematics system 106 may further be configured to and/or collect information from one or more systems of the vehicle 100, to control and/or interact with one or more systems of the vehicle 100 (e.g., a vehicle starter system), to collect and/or provide any type of information useful to a user of the vehicle (e.g., navigational position information), and/or provide any other suitable telematics-related functions.

The telematics system 106 may be communicatively coupled to one or more user devices 114 and/or telematics system service center 116 via a communications network 112. The communication network 112 may facilitate communication between the telematics systems 106, the one or more user devices 114, one or more telematics system service centers 116, and/or other service providers and associated entities directly or via one or more intermediate communication channels utilizing communication servers, switches, and the like. The communication network 112 may include wired and/or wireless communication channels. In certain embodiments, the communications network 112 may comprise a wireless carrier system, such as a personal communications system ("PCS"), a global system for mobile communication, and/or any other suitable communication system incorporating any suitable communication standards and/or protocols. In some embodiments, the communications network 112 may include an analog mobile communications network and/or a digital mobile communications network utilizing, for example, code division multiple access ("CDMA"), Global System for Mobile Communications or Groupe Special Mobile ("GSM"), frequency division multiple access ("FDMA"), and/or time divisional multiple access ("TDMA") standards. In certain embodiments, the communication network 112 may incorporate one or more satellite communication links (not shown). In further embodiments, the communication network may utilize IEEE's 802.11 standards and/or Bluetooth® standards. The telematics system 106 may also include one or more positioning systems (e.g., the Global Positioning System) capable of determining the location of the vehicle 100.

A user device 114 may comprise a general-purpose computing device such as a personal computer or network server, or a specialized computing device such as a cellular telephone, PDA, portable audio or video player, electronic book reader, tablet, television set-top box, kiosk, gaming system, or the like. The telematics system service center 116 may comprise a centralized computing device (e.g., a server) configured to perform a variety of telematics-related services. For example, the telematics system service center 116 may be configured to coordinate and/or facilitate communications between the telematics system 106 included in the vehicle 100 and the user device 114 via the network 112. The telematics system service center 116 may further be configured to coordinate communication between a user and a customer service representative associated with the telematics service and/or emergency response services. In certain embodiments, the telematics system service center 116 may provide access to a local and/or remote database system including, for example, mapping information, traffic information, business location information, and/or any other type of information of interest to a user accessible using the user device 114 and/or telematics system 106.

As illustrated, the telematics system 106 may be communicatively coupled to the vehicle power system 104. The telematics system 106 may be configured to receive information from and/or provide information (e.g., control signals) to one or more systems and/or sensors included in the vehicle power system 104 and/or battery 102. For example, the telematics system 106 may be communicatively coupled to a battery SOC sensor 108 coupled to the vehicle battery 102. The battery SOC sensor 108 may be configured to provide the telematics system 106 with information related to a measured SOC of the vehicle battery 102. For example, the battery SOC sensor 108 may be configured to provide the telematics system 106 with battery SOC information comprising a measured SOC level of the vehicle battery 102 and/or an indication of whether the measured SOC level of the vehicle battery 102 is above, below, or within one or more thresholds.

The battery SOC sensor 108 and/or one or more other sensors may also, or alternatively, be configured to provide other information relating to the vehicle power system 104 and/or battery 102. For example, the battery SOC sensor 108 and/or one or more other sensors may track the SOC of the battery 102 over time to assess the ability of the battery 102 to properly maintain a charge. If the battery 102 indicates a poor or at least less than optimum ability to maintain a charge, one or more components of the system may be configured to notify a user that the battery 102 is not functioning properly. In some cases, such a notification may comprise notifying the user that the battery 102 should be replaced.

The telematics system 106 may utilize the battery SOC information alone, or in conjunction with the telematics system service center 116, to determine whether the measured SOC level of the battery is at, within, or below certain thresholds. In certain embodiments, the threshold may be a low SOC threshold, indicating that the vehicle battery 102 is nearly depleted. In response to determining that a measured SOC level of the battery is at or below a low SOC threshold, the telematics system 106 may generate and transmit a low SOC notification 124 to the user device 114 directly or indirectly via the telematics system service center 116 using the communications network 112.

Upon receiving the low SOC notification 124, the user device 114 may display on a suitable interface (e.g., an LCD display or the like) a low battery SOC notification message 118 indicating that the vehicle battery 102 is nearly depleted. Alternatively, or additionally, the notification may take the form of a phone call from an agent and/or representative of the telematics system 106 and/or telematics system service center 116, a voice mail, or any other suitable means for notification available to one of skill in the art. Similarly, for other notifications, such as a notification of an improperly functioning battery and/or a battery that is need of replacement, a notification may be sent to a user using any of the notification means disclosed herein. For example, the user device 114 may display a message stating "Warning! Battery Charge is Low." The user device 114 may further display a message querying whether the user would like to start the power system 104 of the vehicle 100 to recharge the battery 102. The user device 114 may further present the user with a first selection 120 corresponding with a positive response (i.e., "Yes") and a second selection 122 indicating a negative response (i.e., "No").

A user may select the first selection 120 or the second selection 122 via an interface included on the user device 114 (e.g., a touchscreen, button interface, or the like). Alternatively, according to embodiments in which the user is contacted via telephone, the user may provide verbal instruction to an agent and/or representative or to a voice-recognition system in order to make a desired selection. If a user selects the second selection 122 indicating a negative response to the query, the user device 114 may generate and transmit to the telematics system 106, directly or indirectly via the telematics system service center 116 using the communications network 112, a command configured to cause the telematics system 106 to terminate non-essential electric energy demands in the vehicle 100 (e.g., accessory lighting, alarm systems, vehicle clocks, etc.), thereby minimizing depletion of the battery 102. If, however, the user selects the first selection 120, the user device may generate a vehicle start command 126. The vehicle start command 126 may be transmitted to the telematics system 106, directly or indirectly, via the telematics system service center 116 using the communications network 112.

Upon receiving the vehicle start command 126, the telematics system 106 may cause the power system 104 of the vehicle 100 to recharge the battery 102. For example, if the power system 104 includes an ICE, the telematics system 106 may cause the ICE to start, thereby causing an alternator to charge the vehicle battery 102. According to certain embodiments, prior to starting an ICE, a user may be asked for confirmation that the vehicle 100 is not located within an enclosed structure in order to prevent production of harmful chemicals (e.g., carbon monoxide) in an enclosed structure. Still other embodiments may detect (e.g. by the use of proximity detectors, location sensors, or other sensors) whether the vehicle is located in an enclosed structure prior to starting an ICE. If the power system 104 includes a HV battery system (e.g., a HV battery system in an electric, hybrid, or FC vehicle system), the telematics system 106 may cause the HV battery system to charge the vehicle battery 102. Similarly, if the power system 104 includes a FC system, the telematics system 106 may cause the FC system to charge the vehicle battery 102. If the power system 104 includes a capacitor (e.g., an ultra-capacitor and/or a super-capacitor), the telematics system 106 may cause the capacitor to charge the vehicle battery 102. When the vehicle battery 102 reaches or exceeds certain SOC thresholds, which in some embodiments may be measured and/or determined by the battery SOC sensor 108, the telematics system 106 may cause the power system 104 to terminate battery charging operations (e.g., by turning off the ICE or terminating a HV battery system charging process). By utilizing the power system 104 of the vehicle 100 to charge the vehicle battery 104 in low SOC conditions, total depletion of the vehicle battery 104 may be prevented.

Figure 2:
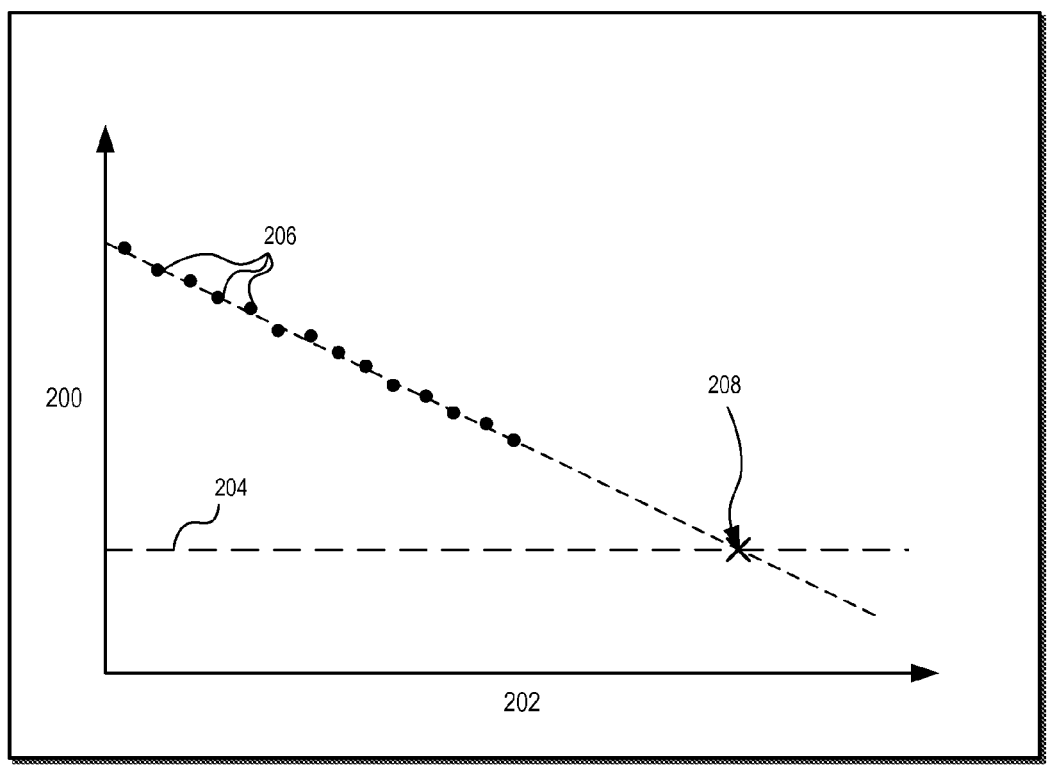
FIG. 2 illustrates a graph showing an exemplary battery SOC in relation to an off-time for a vehicle power system consistent with embodiments disclosed herein.

FIG. 2 illustrates a graph showing an exemplary battery SOC (i.e., axis 200) in relation to an off-time (i.e., axis 202) for a vehicle power system consistent with embodiments disclosed herein. As discussed above, a battery SOC sensor 108 may be utilized to measure the SOC of a vehicle battery 102. In certain embodiments, the SOC of the vehicle battery 102 may be measured by the battery SOC sensor 108 continuously, periodically, randomly, and/or quasi-randomly. Exemplary measured SOC levels are illustrated in FIG. 2 by SOC measurement points 206.

As illustrated, the SOC of a vehicle battery (i.e., axis 200) may decrease with sustained periods of vehicle off-time (i.e., axis 202). As described above, the SOC of the vehicle battery 102 may approach a threshold level 204 indicating that the battery is nearing depletion (e.g., point 208). When a measured SOC of the vehicle battery reaches or falls below the threshold level 204, a low SOC notification 124 may be generated and transmitted to the user device 114, allowing the user to determine whether to start the vehicle power system 104 to recharge the vehicle battery 102 or take other action (e.g., terminating non-essential electric energy demands in the vehicle), as described above in reference to FIG. 1. Although FIG. 2 illustrates only a single threshold level 204, according to other embodiments, multiple thresholds may be established and used to trigger one or more actions in order to prevent or delay the depletion of the vehicle battery 104.

As discussed above, in some embodiments, the telematics system 106 and/or battery SOC sensor 108 may additionally, or alternatively, be configured to monitor the amount of depletion of a battery SOC in relation to the time in order to determine whether a rate at which the charge of the battery 102 is depleting is normal. If the rate of depletion exceeds a particular threshold, or if other parameters sensed by the system indicate abnormal battery function, a notification may be issued by the telematics system 106 to a user indicating that the battery is in need of replacement. In some embodiments, multiple thresholds may be utilized. For example, if the rate at which charge depletion reaches a first threshold, a first notification may be issued that indicates that the life of the battery 102 is nearing its end. In such embodiments, the first notification may provide the user with an estimate for the remaining life of the battery 102. A series of thresholds may also be implemented in such embodiments to provide a corresponding series of estimates of remaining battery life as desired. If a charge depletion exceeds a second (or subsequent) threshold, a second (or subsequent) notification may be provided to a user that suggests that the battery 102 is in need of immediate replacement. In certain embodiments, the notification may comprise a telephone number, address, or other relevant contact information for one or more nearby dealers and/or other businesses who can provide a replacement for the battery 102.

Figure 3:
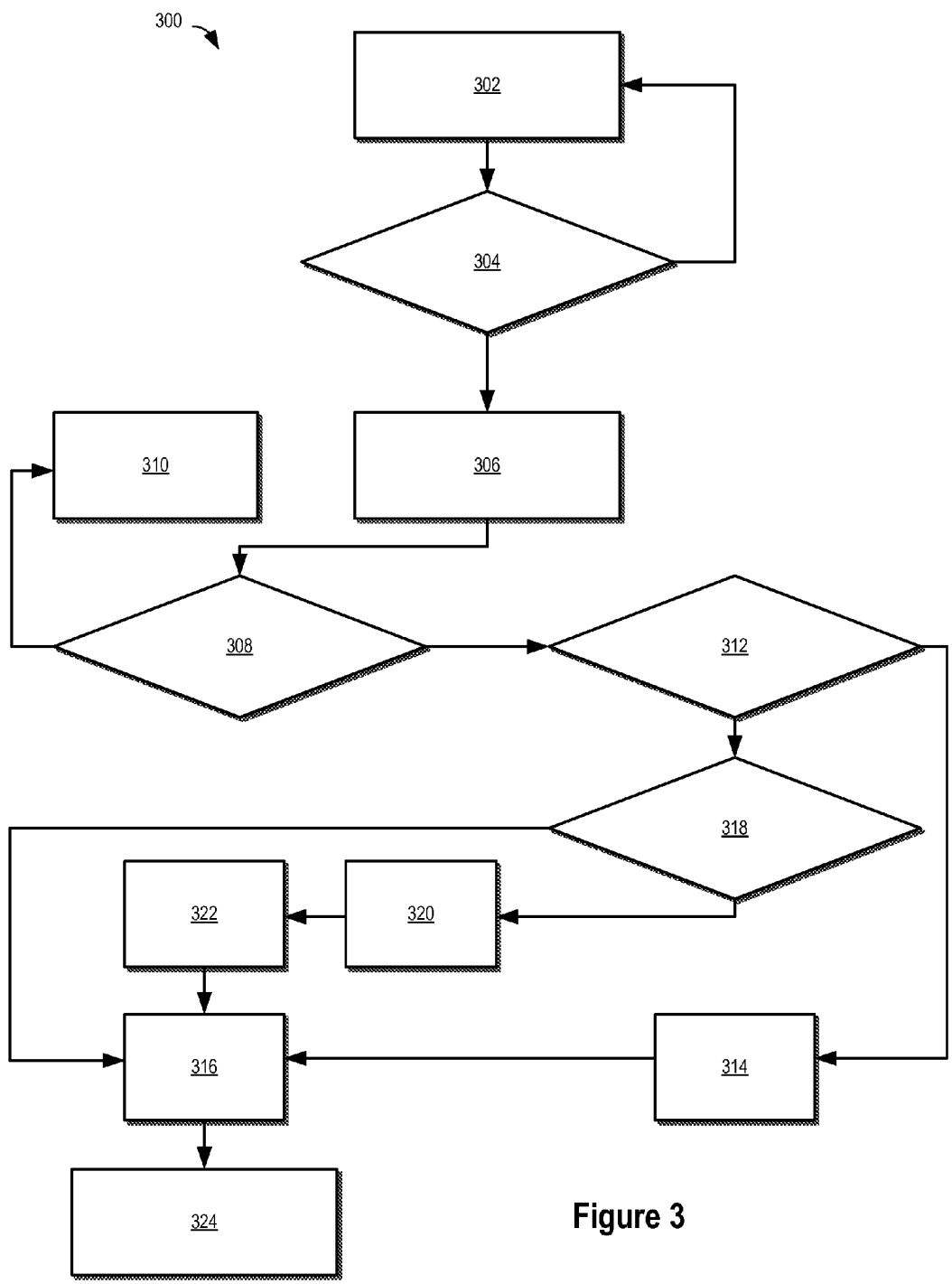
FIG. 3 illustrates a flow chart of an exemplary method for preventing battery depletion in a vehicle consistent with embodiments disclosed herein.

FIG. 3 illustrates a flow chart of an exemplary method 300 for preventing battery depletion in a vehicle 100 consistent with embodiments disclosed herein. At 302, a telematics system 106 included in the vehicle 100 may monitor an SOC of a battery 102 using a battery SOC sensor 108. The telematics system 106 may monitor the SOC of the battery 102 continuously, periodically, randomly, and/or quasi-randomly. At 304, the telematics system 106 and/or the battery SOC sensor 108 may determine whether a measured SOC of the battery 102 is at, below, or within one or more thresholds. In certain embodiments, a threshold may indicate that the vehicle battery 102 is nearing depletion. If the measured SOC of the battery 102 has not reached the threshold, the telematics system 106 and/or the battery SOC sensor 108 may continue to monitor the SOC of a battery 102 (i.e., 302). If, however, the measured SOC of the battery 102 has reached or fallen below the threshold, at 306, the telematics system 106 may transmit to a device 114 associated with a user, via a communication network 112 and/or a telematics system service center 116, a low SOC notification 124 indicating that the SOC of the battery 102 is nearing depletion.

Upon receipt of the low SOC notification 124, at 308, the user may provide a response via the user device 114 regarding whether the user would like to start the vehicle power system 104 to recharge the battery 102. If the response indicates that the user would not like to start the vehicle power system, at 310, a command may be sent to the telematics system 106 configured to cause the telematics system 106 to terminate non-essential electric energy demands in the vehicle 100, thereby minimizing depletion of the battery 102. If the response, however, indicates that the user would like to the start the vehicle power system 104 to recharge the battery 102, the method 300 may proceed to 312. In certain embodiments, the vehicle power system 104 may include a HV power system, a FC power system, an ICE power system, a capacitor system, and/or any other suitable power system.

In some embodiments, at 312, a determination may be made as to whether the vehicle 100 includes an intermediate power storage system such as an HV battery system (e.g., as in an electric, hybrid, or FC power system), a capacitor system, and/or any other suitable power storage system. If the vehicle 100 does not include an intermediate power storage system (e.g., a HV battery system as in an FC power system), at 314, the user device 114 may transmit a vehicle start command 126 to the telematics system 106, directly or indirectly, via the telematics system service center 116 using the communications network 112. Upon receipt of the vehicle start command 126, the telematics system 106 may cause the vehicle power system 104 to start and charge the vehicle battery 102 (e.g., via an alternator) at 316. When the vehicle battery 102 reaches or exceeds certain charging thresholds, at 324, the telematics system 106 may terminate battery charging operations.

If the vehicle 100 does include an intermediate power storage system (e.g., HV battery system), at 318, a determination may be made as to whether the intermediate power storage system battery system is at or below certain SOC thresholds. If the intermediate power storage system is above the SOC thresholds, the intermediate power storage system may proceed to charge the vehicle battery 102. When the vehicle battery 102 reaches or exceeds certain charging thresholds, at 324, the telematics system 106 may terminate battery charging operations. If the intermediate power storage battery system is at or below the SOC thresholds, the intermediate power storage system may require charging before charging the vehicle battery 102. Accordingly, at 320, an available vehicle power system 104 (e.g., a FC system configured to provide power to a HV battery) may be started and the intermediate power storage system may be charged at 322. Once the intermediate power storage system has been charged to a certain SOC level, at 316 the intermediate power storage system may charge the vehicle battery 102. In further embodiments, an ICE system, a FC system, a capacitor system, a HV battery system, and/or any other suitable system may charge the vehicle battery 102 directly (i.e., without an intermediate battery system). When the vehicle battery 102 reaches or exceeds certain charging thresholds, at 324, the telematics system 106 may terminate battery charging operations.

The systems and methods disclosed herein are not inherently related to any particular computer or other apparatus and may be implemented by a suitable combination of hardware, software, and/or firmware. Software implementations may include one or more computer programs comprising executable code/instructions that, when executed by a processor, may cause the processor to perform a method defined at least in part by the executable instructions. The computer program can be written in any form of programming language, including compiled or interpreted languages, and can be deployed in any form, including as a standalone program or as a module, component, subroutine, or other unit suitable for use in a computing environment. Further, a computer program can be deployed to be executed on one computer or on multiple computers at one site or distributed across multiple sites and interconnected by a communication network. Software embodiments may be implemented as a computer program product that comprises a non-transitory storage medium configured to store computer programs and instructions that, when executed by a processor, are configured to cause the processor to perform a method according to the instructions. In certain embodiments, the non-transitory storage medium may take any form capable of storing processor-readable instructions on a non-transitory storage medium. A non-transitory storage medium may be embodied by a compact disk, digital-video disk, a magnetic tape, a Bernoulli drive, a magnetic disk, a punch card, flash memory, integrated circuits, or any other non-transitory digital processing apparatus memory device.

Although the foregoing has been described in some detail for purposes of clarity, it will be apparent that certain changes and modifications may be made without departing from the principles thereof. For example, a user device 114 may present a user with a present indication of a fuel level of an ICE vehicle or a FC or battery energy level in conjunction with a low SOC notification message 118 to and/or first and second selections 120, 122 to aid the user in determining whether to issue a vehicle start command 126. It is noted that there are many alternative ways of implementing both the processes and apparatuses described herein. Accordingly, the present embodiments are to be considered illustrative and not restrictive, and the invention is not to be limited to the details given herein, but may be modified within the scope and equivalents of the appended claims.

The foregoing specification has been described with reference to various embodiments. However, one of ordinary skill in the art will appreciate that various modifications and changes can be made without departing from the scope of the present disclosure. For example, various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

As used herein, the terms "comprises" and "includes," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Those having skill in the art will appreciate that many changes may be made to the details of the above-described embodiments without departing from the underlying principles of the invention. The scope of the present invention should, therefore, be determined only by the following claims.

The invention claimed is:

1. A method for preventing depletion of a battery included in a vehicle comprising:
   receiving a measurement of the state-of-charge (SOC) of the battery from an SOC sensor;
   determining that the SOC of the battery has reached a first threshold;
   based on the determination, transmitting a notification to a remote device associated with a user;
   receiving an indication from the remote device to start an intermediate power storage system of the vehicle to recharge the battery;
   determining whether the intermediate power storage system has an SOC of at least a second threshold; and
   if the intermediate power storage system has an SOC of at least the second threshold, generating a command to charge the battery with electrical energy supplied by the intermediate power storage system, otherwise, generating a command to charge the intermediate power storage system with energy provided by a power system.

2. The method of claim 1, wherein the notification further comprises a query as to whether the user would like to start a system of the vehicle to recharge the battery.

3. The method of claim 2, wherein the method further comprises:
   receiving an indication from the remote device to not start the intermediate power storage system of the vehicle to recharge the battery; and
   in response to receiving the indication, generating a command to terminate non-essential energy demands in the vehicle.

4. The method of claim 1, wherein the method further comprises generating a command to terminate charging of the battery based on a determination that an SOC of the battery has reached a third threshold.

5. The method of claim 1, wherein the indication from the remote device comprises an indication that the user would like to start a high voltage battery system of the vehicle to recharge the battery.

6. The method of claim 1, wherein the indication from the remote device comprises an indication that the user would like to start a capacitor system of the vehicle to recharge the battery.

7. The method of claim 1, wherein the method further comprises generating a command to terminate charging of the intermediate power storage system based on a determination that an SOC of the intermediate power storage system has exceeded a fourth threshold.

8. The method of claim 1, wherein generating the command to charge the intermediate power storage system comprises a command to charge the intermediate power storage system with energy provided by an internal combustion engine.

9. The method of claim 1, wherein generating the command to charge the intermediate power storage system comprising a command to charge the intermediate power storage system with energy provided by a fuel cell system.

10. The method of claim 1, wherein receiving the measurement of the SOC of the battery comprises receiving a measurement of the SOC of a low voltage battery and determining that the SOC of the battery has reached the first threshold comprises determining that the SOC of the low voltage battery has reached the first threshold.

11. The method of claim 1, wherein receiving the measurement of the SOC of the battery comprises receiving a measurement of the SOC of a 12V automotive battery and determining that the SOC of the battery has reached the first threshold comprises determining that the SOC of the 12V automotive battery has reached the first threshold.

12. The method of claim 1, wherein the notification further comprises an indication of a fuel level of the internal combustion engine.

13. The method of claim 9, wherein the notification further comprises an indication of an SOC of the intermediate power storage system.

14. The method of claim 1, wherein the notification comprises a low SOC notification comprising an indication that the SOC of the battery is low.

15. The method of claim 1, wherein the notification is transmitted using a telematics system included in the vehicle.

16. A telematics system for preventing depletion of a battery included in a vehicle comprising:
   a receiver configured to receive a measured state-of-charge (SOC) of the battery;

processing logic communicatively coupled to the receiver configured to determine whether the received measured SOC of the battery has reached a first predetermined threshold;

a communications interface communicatively coupled with the processing logic configured to:

transmit a low SOC notification to a remote device associated with a user comprising an indication that the SOC of the battery is low, and receive an indication from the remote device to start an intermediate power storage system of the vehicle to recharge the battery;

wherein the processing logic is further configured to:

determine whether the intermediate power storage system has an SOC of at least a second threshold; and if the intermediate power storage system has an SOC of at least the second threshold, generate a command to charge the battery with electrical energy supplied by the intermediate power storage system, otherwise, generate a command to charge the intermediate power storage system with energy provided by a power system.

* * * * *